US012573461B2

(12) United States Patent
Kim et al.

(10) Patent No.: US 12,573,461 B2
(45) Date of Patent: Mar. 10, 2026

(54) MANAGING SENSE AMPLIFIER LATCH AND DATA LATCH VOLTAGE TO REDUCE STANDBY CURRENT

(71) Applicant: Micron Technology, Inc., Boise, ID (US)

(72) Inventors: Kwang Ho Kim, Pleasanton, CA (US); Erwin E. Yu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 18/387,217

(22) Filed: Nov. 6, 2023

(65) Prior Publication Data

US 2024/0170075 A1  May 23, 2024

Related U.S. Application Data

(60) Provisional application No. 63/426,616, filed on Nov. 18, 2022.

(51) Int. Cl.
*G11C 16/26* (2006.01)
*G11C 16/24* (2006.01)

(52) U.S. Cl.
CPC .............. *G11C 16/26* (2013.01); *G11C 16/24* (2013.01)

(58) Field of Classification Search
CPC ................................ G11C 16/26; G11C 16/24
USPC ...................................... 365/185.21
See application file for complete search history.

(56) References Cited

U.S. PATENT DOCUMENTS

2012/0140572 A1* 6/2012 Kim ........................ G11C 16/30
365/189.05
2022/0020435 A1* 1/2022 Moschiano .............. G11C 7/12

* cited by examiner

*Primary Examiner* — Huan Hoang
(74) *Attorney, Agent, or Firm* — Lowenstein Sandler LLP

(57) ABSTRACT

Entry of a memory device into a standby mode is determined. During the standby mode of the memory device, a first bias voltage level is caused to be applied to a sense amplifier latch of a sense amplifier of a page buffer circuit of the memory device. During the standby mode, a second bias voltage level is caused to be applied to a set of data latches of the sense amplifier of the page buffer circuit of the memory device, wherein the second bias voltage level is different from the first bias voltage level.

20 Claims, 11 Drawing Sheets

Figure 3:
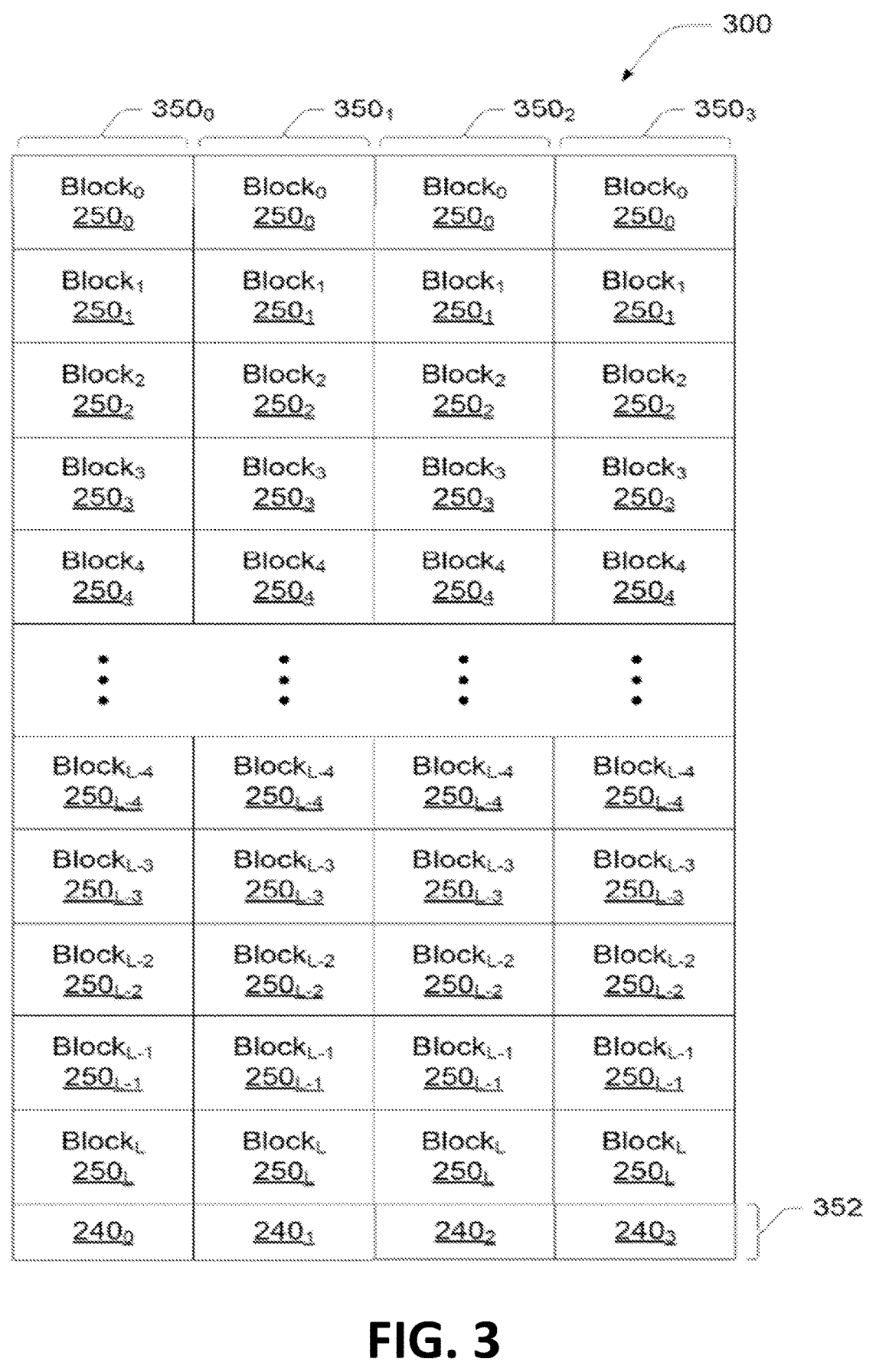

| | | | |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

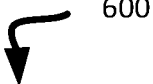 600

Determine entry of a memory device into a standby mode
610

Cause, during the standby mode of the memory device, a first bias voltage level to be applied to a sense amplifier latch of a sense amplifier of a page buffer circuit of the memory device
620

Cause, during the standby mode of the memory device, a second bias voltage level to be applied to a set of data latches of the sense amplifier of the page buffer circuit of the memory device, where the second bias voltage level is different from the first bias voltage level
630

MANAGING SENSE AMPLIFIER LATCH AND DATA LATCH VOLTAGE TO REDUCE STANDBY CURRENT

CROSS-REFERENCE TO RELATED APPLICATION

This application claims the benefit of U.S. Provisional Application No. 63/426,616, filed Nov. 18, 2022, the entirety of which is incorporated herein by reference.

TECHNICAL FIELD

Embodiments of the disclosure relate generally to memory sub-systems, and more specifically, relate to managing sense amplifier latch and data latch voltage to reduce standby current in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A-2D are schematics of portions of an array of memory cells as could be used in a memory of the type described with reference to FIG. 1B, in accordance with one or more embodiments of the present disclosure.

FIG. 3 is a block schematic of a portion of an array of memory cells as could be used in a memory of the type described with reference to FIG. 1B, in accordance with one or more embodiments of the present disclosure.

FIG. 6 is a flow diagram of an example method to manage bias voltage levels applied to latches (e.g., a sense amplifier latch and a set of data latches) of a sense amplifier of a page buffer circuit when a memory device is operating in a standby mode, in accordance with some embodiments of the present disclosure, in accordance with one or more embodiments of the present disclosure.

DETAILED DESCRIPTION

Figure 1A:
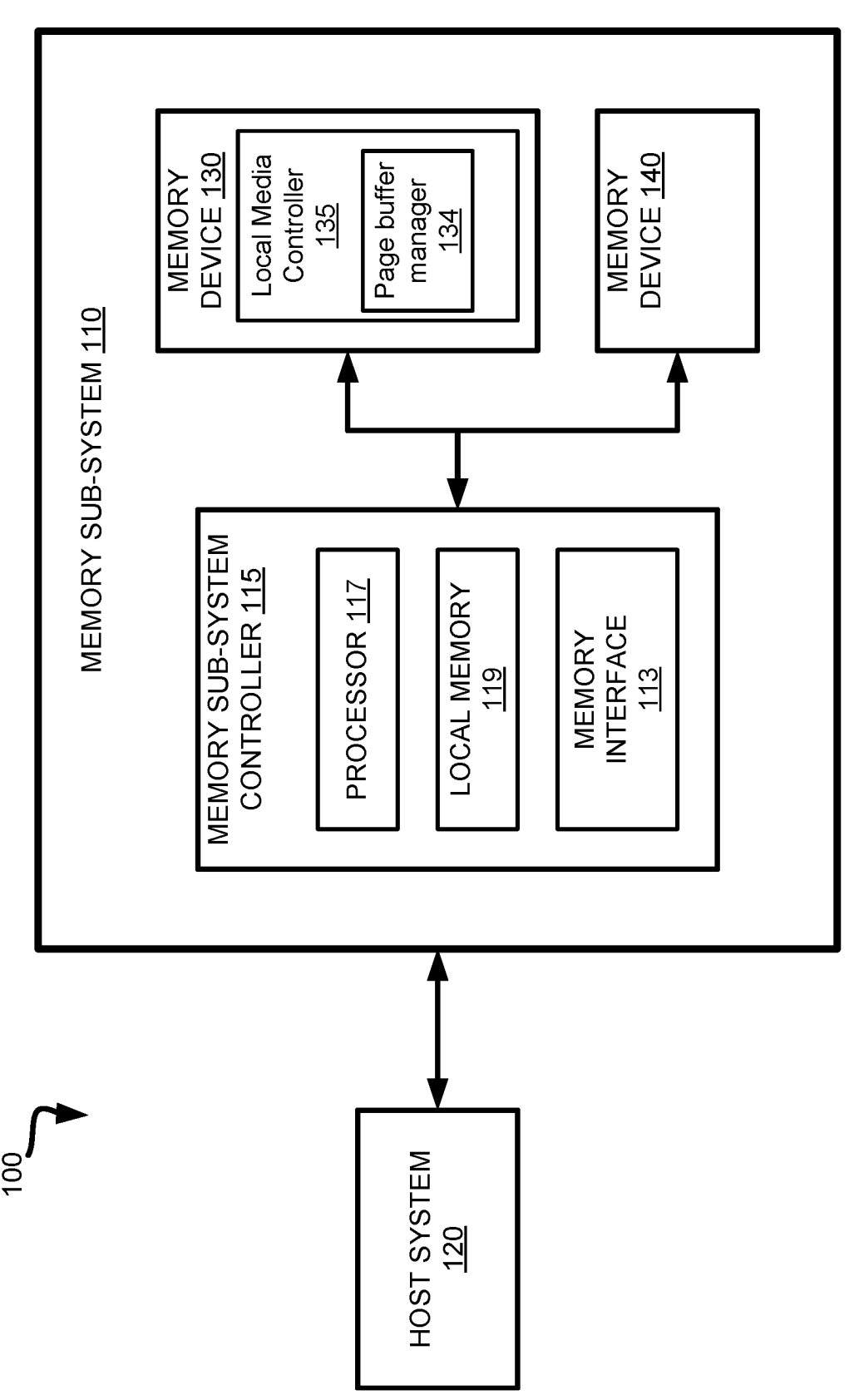
FIG. 1A illustrates an example computing system that includes a memory sub-system, in accordance with one or more embodiments of the present disclosure.

Aspects of the present disclosure are directed to managing sense amplifier latch and data latch bias voltage levels to reduce standby current in a memory device in a memory sub-system. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device (e.g., a memory die) can include memory cells arranged in a two-dimensional or a three-dimensional grid. The memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage Vt (also referred to as the "threshold voltage") such that the source-drain electric current is low for the control gate voltage ($V_{CG}$) being below the threshold voltage, $V_{CG}$<Vt. The current increases substantially once the control gate voltage has exceeded the threshold voltage, $V_{CG}$>Vt. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval [Vt,Vt+dVt] when charge Q is placed on the cell.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell (1 bit for upper page (UP) data and 1 bit for lower page (LP) data) and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell (1 bit for UP data, 1 bit for LP data and 1 bit for extra page (XP) data) and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell (1 bit for UP data, 1 bit for LP data, 1 bit for XP data, and 1 bit for top page (TP) data) and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2n levels of charge to store n bits of information for n pages. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

One or more memory access operations can be performed with respect to the memory cells of the memory device. In an illustrative example, a memory cell programming operation, which can be performed in response to receiving a program or write command from the host, can involve sequentially applying programming voltage pulses to a selected or target wordline (WLn). In some implementations, the programming pulse voltage can be sequentially ramped up from the initial voltage value (e.g., 0V) to the final voltage value (e.g., $V_{MAX}$). The unselected wordlines can, during the programming operation, be biased at a certain voltage, e.g., a pass through voltage, which is less than the programming voltage. After each programming pulse, or after a number of programming pulses, a program verify operation can be performed to determine if the threshold voltage of the one or more memory cells has increased to a desired programming level.

In certain memory sub-systems it is common to receive a request to perform a memory access operation, such as a program operation of data from a host system to a memory array of a memory device, and then to subsequently receive a request to perform another memory access operation, such as a read operation, on that same data from the host system. The memory device being programmed includes a number of page buffers (also referred to as page cache).

For example, each page buffer circuit of a memory device includes a sense amplifier, which includes a latch (i.e., a sense amplifier latch) and a series of data latches. The sensing devices (e.g., sense amplifiers) sense a data state of a memory cell of the array of memory cells. For example, the sense amplifier of the page buffer can sense a state of a data line connected to that memory cell. The memory device includes a local media controller that communicates with the page buffer circuit in association with the execution of a memory access operation.

The page buffer circuit latches data associated with a memory access operation (e.g., either incoming data or outgoing data) in response to commands from the local media controller. The page buffer includes a series of transistors configured to temporarily store data while the array of memory cells is busy programming or reading other data. For example, during a program operation, data may be passed from a cache register to a data page buffer for transfer to the array of memory cells of the memory device, and new data may be latched in the cache register. In another example, during a read operation, data may be passed from the cache register to input/out control circuitry for output to a memory sub-system controller, and new data may be passed from the data page buffer to the cache register. The cache register and/or the data page buffer may form (e.g., may form a portion of) a page buffer of the memory device.

A current associated with a bias voltage level is continuously supplied to the sense amplifier and the set of data latches to enable operation of the page buffer circuit during a standby mode or stage of operation (i.e., when no memory access operation is being performed by the memory device) to enable the latches to hold or store the data. Supplying this current associated with the bias voltage to the sense amplifier latch and data latches results in a high level of standby current (i.e., current consumed while the memory device is in the standby mode) associated with the memory device. Correspondingly, this higher standby current causes a higher overall power consumption level for the memory device.

Aspects of the present disclosure address the above and other deficiencies by segregating or separating a power domain corresponding to the sense amplifier latch from a power domain of the set of data latches of a page buffer. In an embodiment, a first bias voltage level is supplied to the sense amplifier latch of the page buffer and a second bias voltage level is supplied to the set of data latches of page buffer. In an embodiment, a bias voltage level applied to power the sense amplifier latch (i.e., a first bias voltage level (Vbias1) is reduced during the standby mode of the memory device. In an embodiment, the first bias voltage level (Vbias1) applied to the sense amplifier latch during the standby mode is equal to an initial voltage level (i.e., Vbias1_initial) minus a delta voltage level (Vdelta). In this embodiment, while the first bias voltage level is reduced during the standby mode (i.e., Vbias1=Vbias1_initial−Vdelta), the second bias voltage applied to power the set of data latches (e.g., data latch 1, data latch 2 . . . data latch N) is maintained at an initial level (i.e., Vbias2_initial).

In another embodiment, during the standby mode, the second bias voltage applied to power the set of data latches of the page buffer can be reduced or lowered by a delta voltage level (Vdelta) from an initial voltage (i.e., Vbias2=Vbias2_initial−Vdelta). In this embodiment, while the second bias voltage level is reduced or lowered, the first bias voltage level is maintained at an initial level during the standby mode (e.g., Vbias1=Vbias1_initial).

In an embodiment, the delta voltage level (Vdelta) is in a range of approximately 1V to approximately 1.5V. In an embodiment, the delta voltage level (Vdelta) represents the amount that the first bias voltage supplied to the sense amplifier latch, the second bias voltage supplied to the set of data latches, or both, in order to establish a target standby current level. Advantageously, separating and differentiating the voltage levels supplied to the sense amplifier latch and the set of data latches of the page buffer results in a reduction in the overall current consumed by the memory device operating in the standby mode, while enabling the sense amplifier latch and the set of data latches to continue to hold or store data.

In another embodiment, during the standby mode of the memory device, the power supply to one or more sense amplifier latches, one or more data latches, or a combination thereof, can be turned off (i.e., one or more PMOS can be turned off such that no bias voltage is supplied to one or more sense amplifier latches, one or more data latches, or a combination thereof). Advantageously, while in the standby mode, the sense amplifier latch of the page buffer is not powered, thereby reducing the overall standby current level of the memory device. In this embodiment, a determination is made that the data stored in the sense amplifier latch and/or one or more data latches is not needed, and, in response, the corresponding one or more sense amplifier latches, one or more data latches, or combination thereof, are turned off (i.e., not powered). Accordingly, instead of continuously powering the sense amplifier latch and/or one or more data latches of a sense amplifier during standby, no bias voltage (i.e., no power) is supplied to the selected sense amplifier latch and/or one or more data latches, thereby causing a reduction in the standby current level.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory page buffers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controllers 135 can implement a page buffer manager 134 that can manage the bias voltage supplies to the sense amplifier latch and the set of data latches of a page buffer while the memory device 130 is in a standby mode. In an embodiment, the power domains of the sense amplifier latch and the set of data latches can be segregated during the standby mode, such that a first bias voltage supplied to the sense amplifier latch (Vbias1) and a second bias voltage supplied to the set of latches are independently controllable. According to embodiments, one or both of the first bias voltage level (supplied to the sense amplifier of the page buffer) and the second bias voltage level (supplied to the set of data latches of the page buffer) can be reduced or lowered from a respective initial voltage level (e.g., Vbias1_initial and Vbias2_initial) during the standby mode of the memory device. In an embodiment, while in the standby mode, the page buffer manager 134 causes the first bias voltage level (Vbias1) to be supplied to the sense amplifier latch of the page buffer circuit that is lower than an initial first bias voltage level (Vbias1_initial). An example Vbias1_initial can be approximately 2.0V to approximately 2.5V). In an embodiment, while in the standby mode, the page buffer manager 134 can cause a second bias voltage level (Vbias2) to be supplied to the set of data latches of the page buffer circuit that is lower than an initial second bias voltage level (Vbias2_initial). An example Vbias1_initial can be approximately 1.5V to approximately 2.0V).

According to embodiment, the page buffer manager 134 can identify a suspend operation and determine that the data stored in the sense amplifier latch and the set of data latches is to be maintained in anticipation of a subsequent resume operation. In response to the identification of the suspend operation, in order to maintain storage of the data in the sense amplifier latch and the set of data latches during standby mode, the page buffer manager 134 can reduce or lower one or both of the first bias voltage level or the second bias voltage level from a respective initial level by a delta voltage level (Vdelta). For example, in an embodiment, to maintain the data (i.e., in view of a suspend operation), the page buffer manager 134 can establish the first bias voltage level (Vbias1) by reducing an initial voltage level (Vbias1_initial) by the Vdelta (e.g., approximately 1.0V to approximately 1.5V). In another example, in an embodiment, to maintain storage of the data, the page buffer manager 134 can establish the second bias voltage level (Vbias2 that is supplied to the set of data latches) by reducing the initial voltage level (Vbias2_initial) by the Vdelta. In another embodiment, both the first bias voltage level (Vbias1) and the second bias voltage level (Vbias2) are reduced or lowered relative to a respective initial voltage level (i.e., Vbias1_initial and Vbias2_initial).

In an embodiment, the page buffer manager 134 can identify a cache operation that indicates that the data stored in the sense amplifier latch and set of data latches is to be maintained. In response to identifying the cache operation, the page buffer manager 134 can adjust (i.e., lower) one or both of the first bias voltage supplied to the sense amplifier latch of the page buffer circuit and/or the second bias voltage supplied to the set of data latches of the page buffer circuit.

According to embodiments, in response to detection of entry into the standby mode, the page buffer manager 134 can cause the sense amplifier latch to be turned off (i.e., a PMOS associated with sense amplifier is turned off) such that sense amplifier is not powered, thereby reducing the overall standby current. In this embodiment, the page buffer manager 134 turns off the sense amplifier latch, which results in a reduction in the current and power consumption while the memory device is in standby mode. In an embodiment, the page buffer manager 134 can turn off the voltage supply to one or more sense amplifier latches and/or one or more data latches of the page buffer circuit in response to determining that a previous memory access operation has been completed.

Figure 1B:
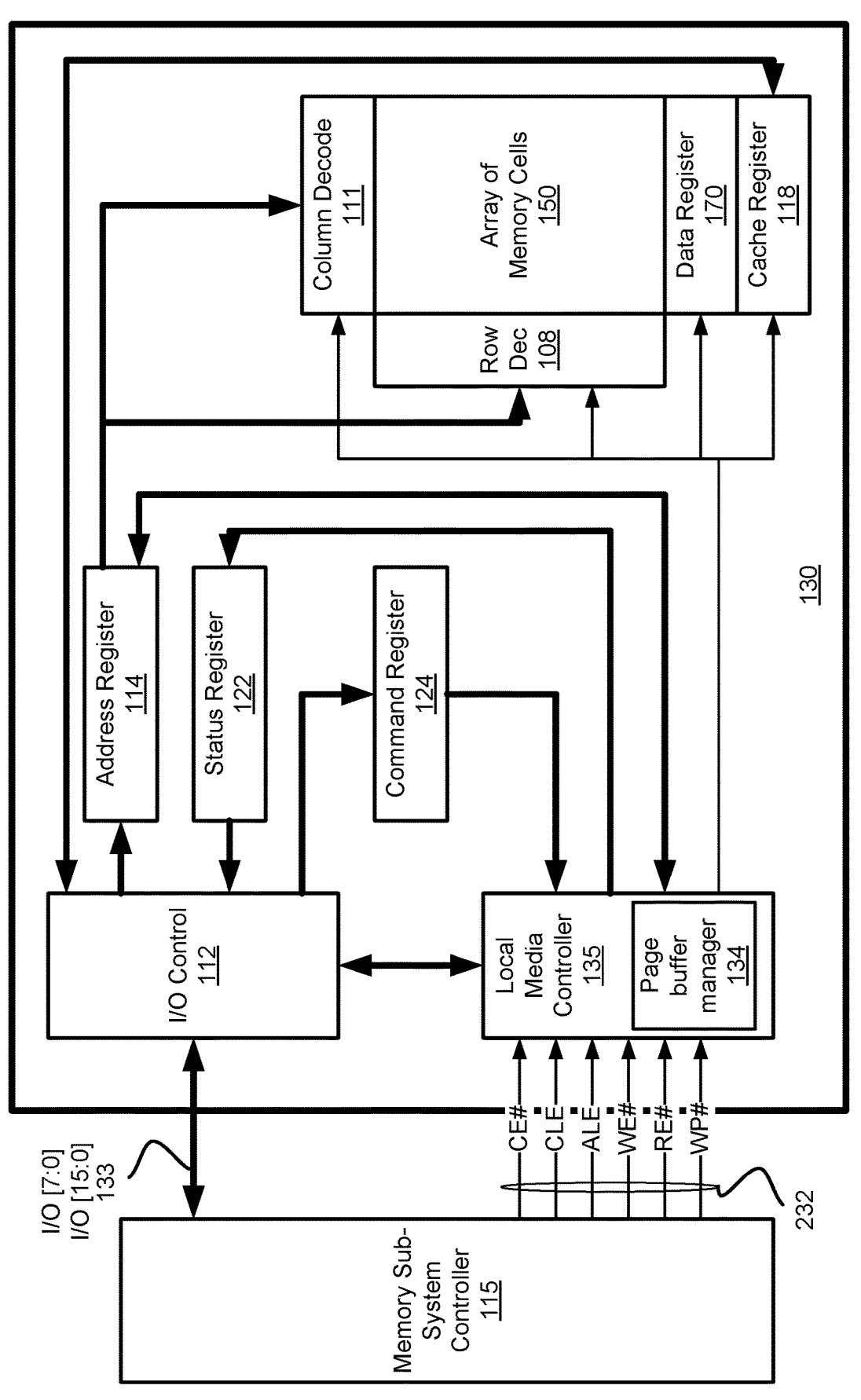
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 111 are provided to decode address signals. Address signals are received and decoded to access the array of memory cells 104. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register (or command page buffer) 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses. In one embodiment, local media controller 135 includes the page buffer manager 134, which can implement the execution of at least a portion of the prologue sub-operations of a programming operation during a data loading stage to reduce a total programming time associated with the programming operation of a set of target memory cells of the memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 112. During a read operation, data may be passed from the cache register 118 to the I/O control circuitry 112 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory subsystem controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 112 and may then be written into command register 124. The addresses may be received over input/output (I/O) pins [7:0] of I/O bus 136 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
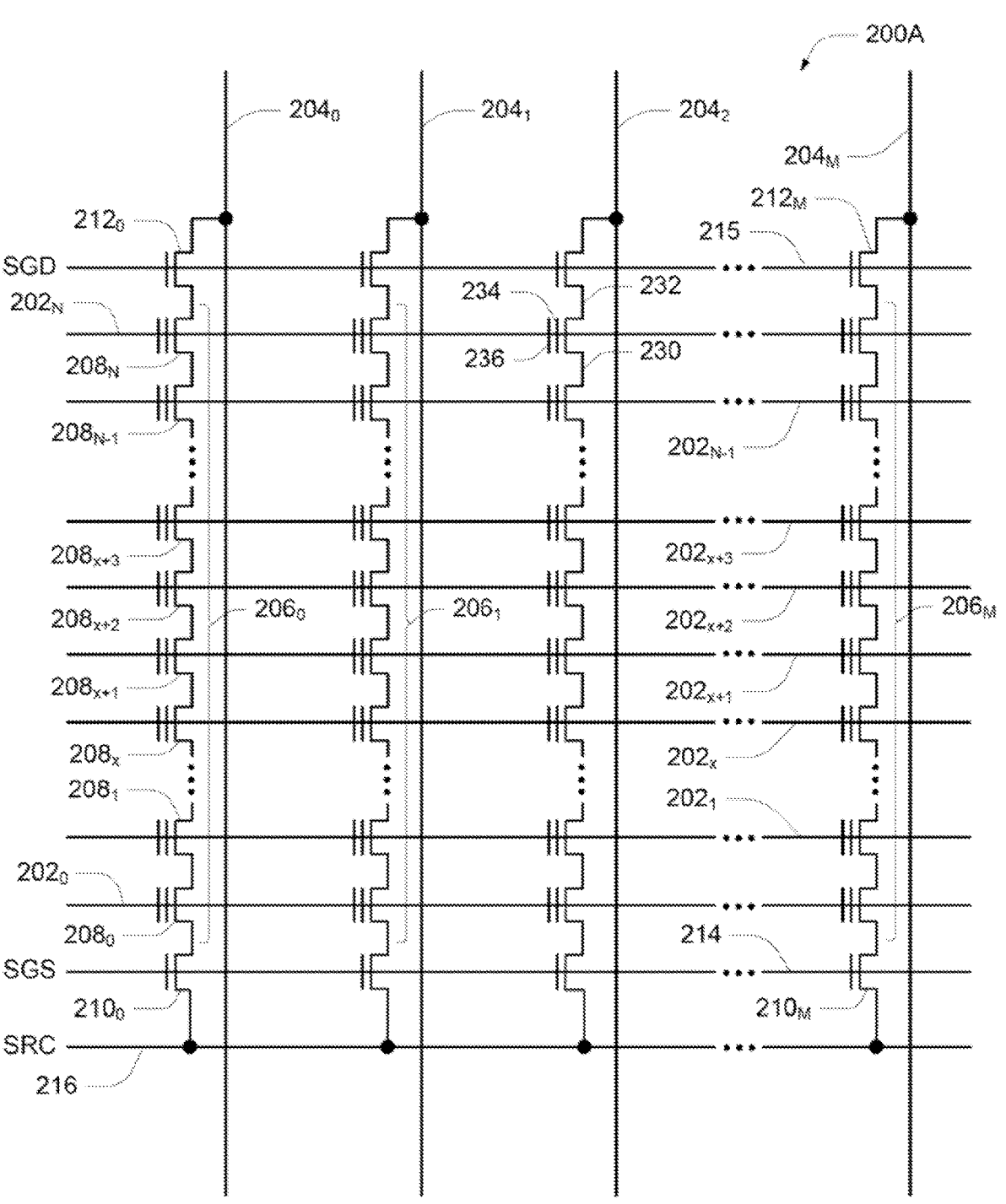
Figure 2B:
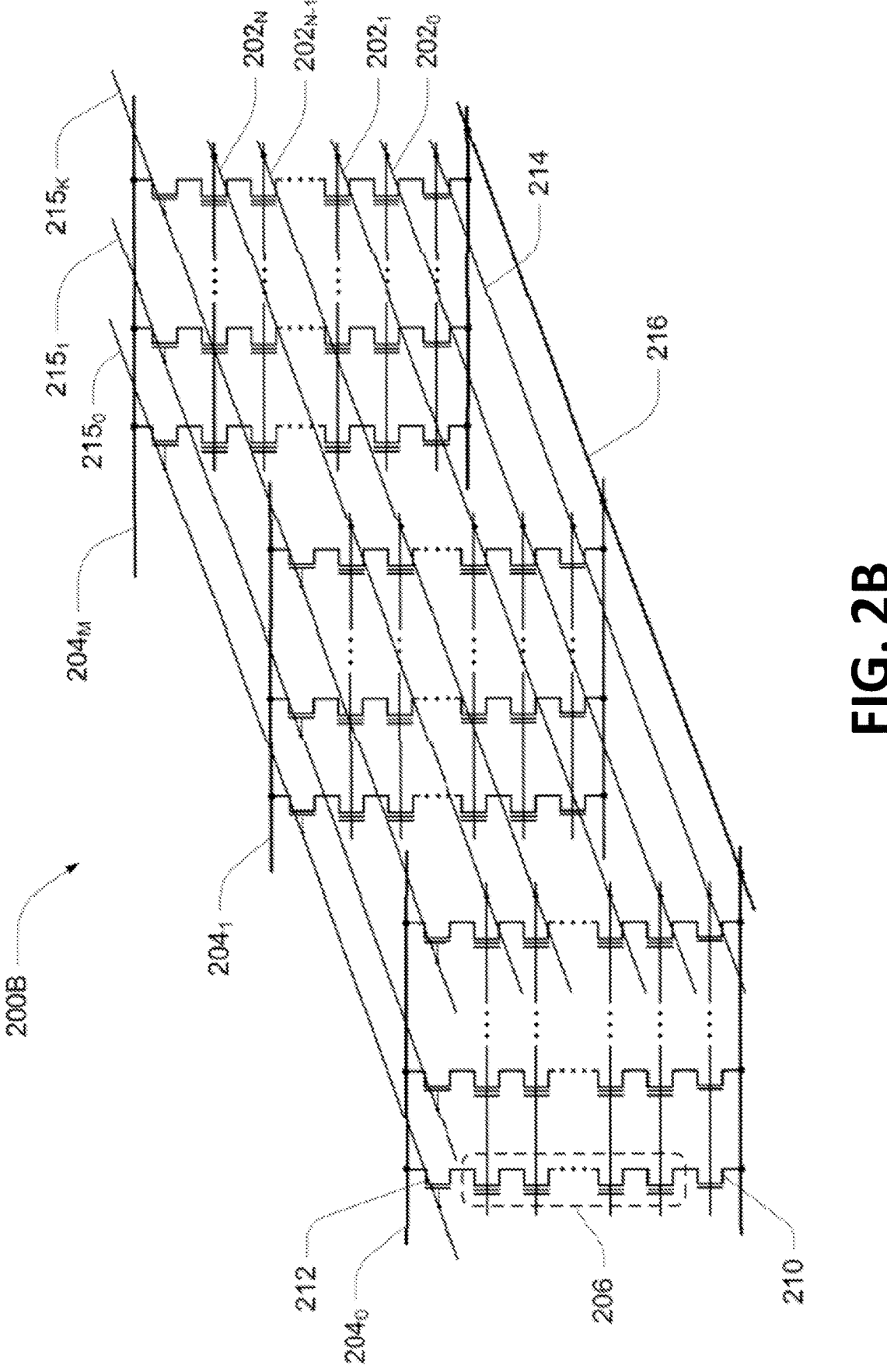
Figure 2C:
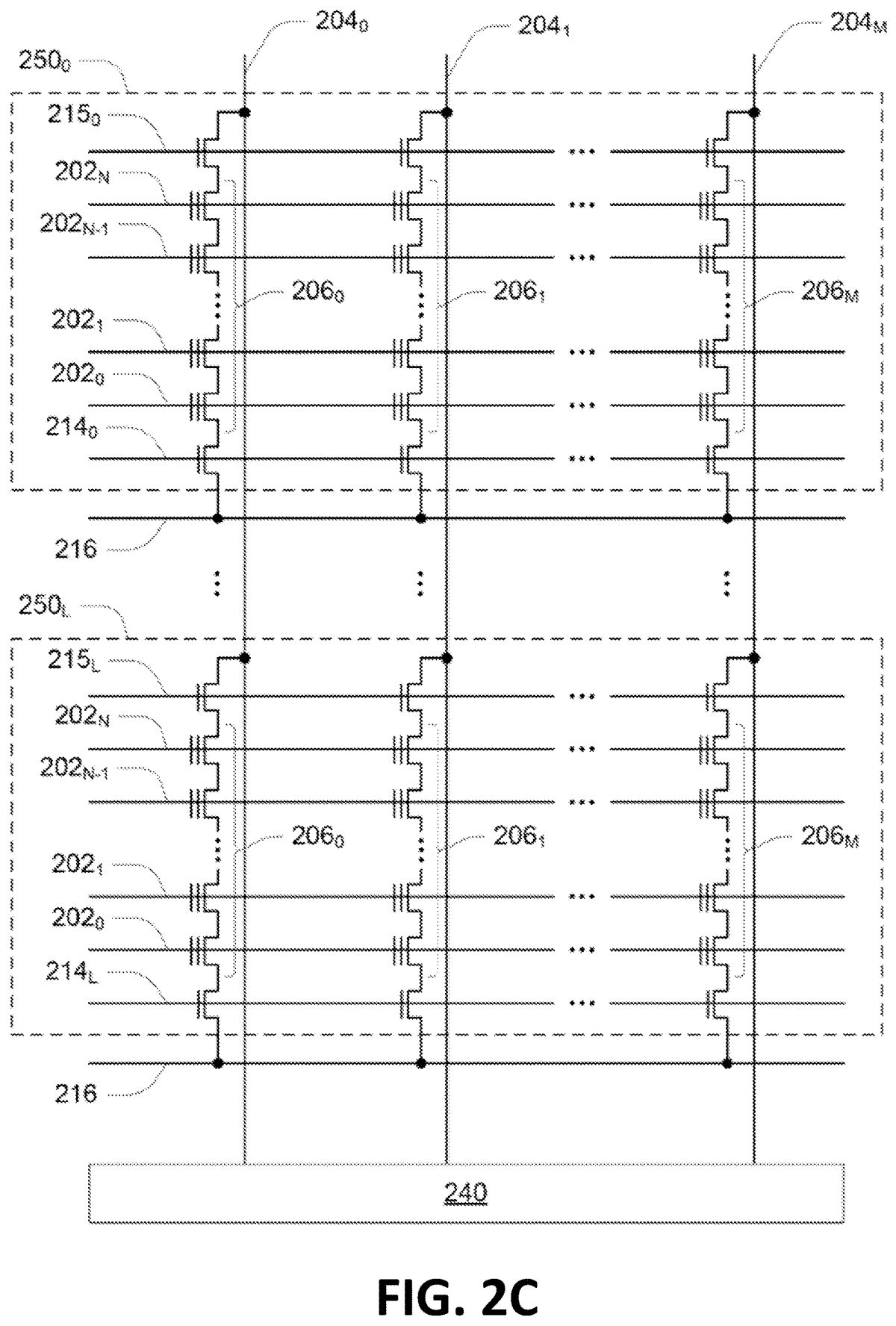

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Subsets of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 2D:
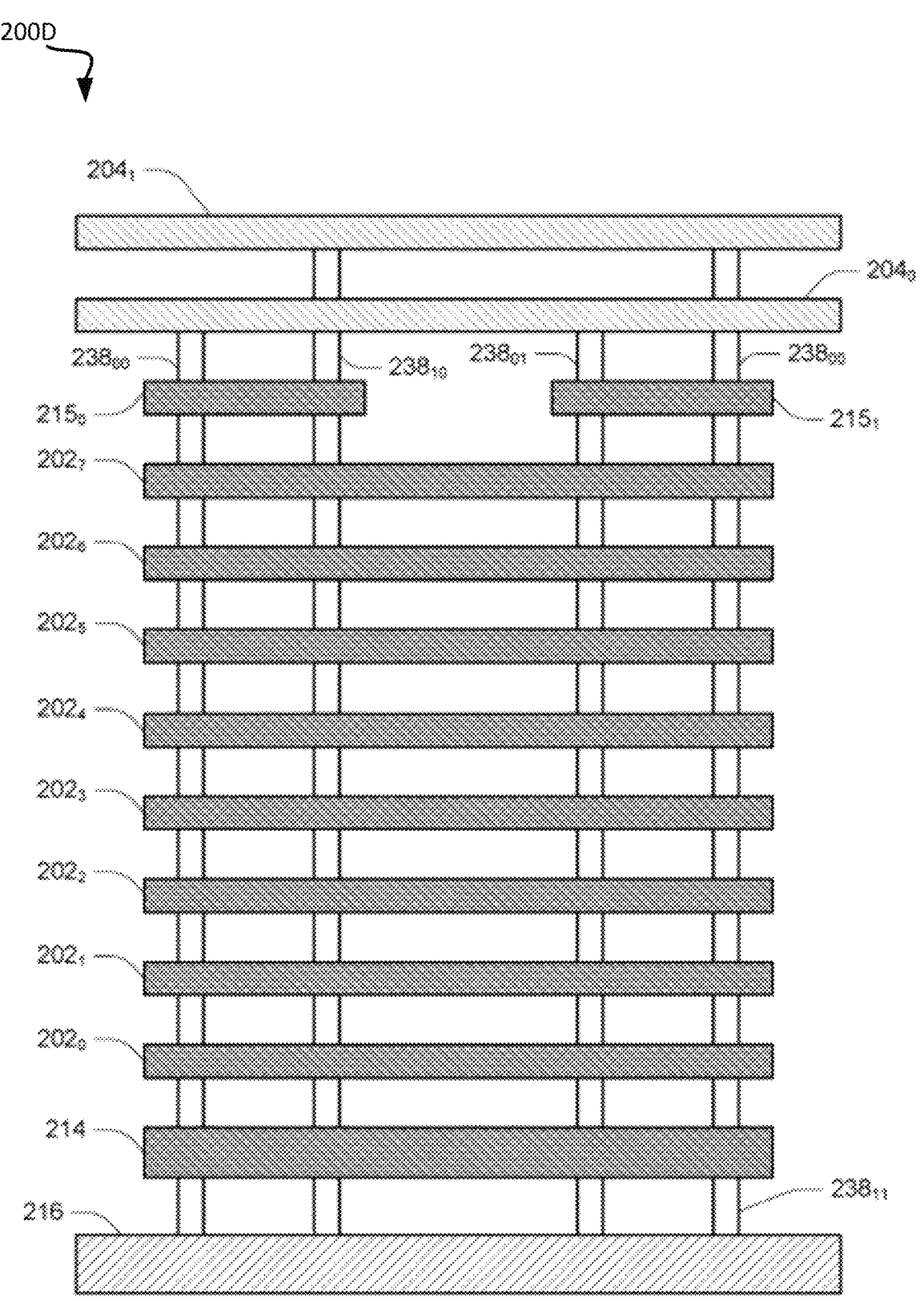

FIG. 2D is a diagram of a portion of an array of memory cells 200D (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2C) selectively connected to the bitline $204_0$. Similarly, channel regions $238_{10}$ and $238_{11}$ represent the channel regions of different strings of series-connected memory cells (e.g., NAND strings 206 of FIGS. 2A-2C) selectively connected to the bitline $204_1$. A memory cell (not depicted in FIG. 2D) may be formed at each intersection of an wordline 202 and a channel region 238, and the memory cells corresponding to a single channel region 238 may collectively form a string of series-connected memory cells (e.g., a string 206 of FIGS. 2A-2C). Additional features might be common in such structures, such as dummy wordlines, segmented channel regions with interposed conductive regions, etc.

FIG. 3 is a block schematic of an example portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
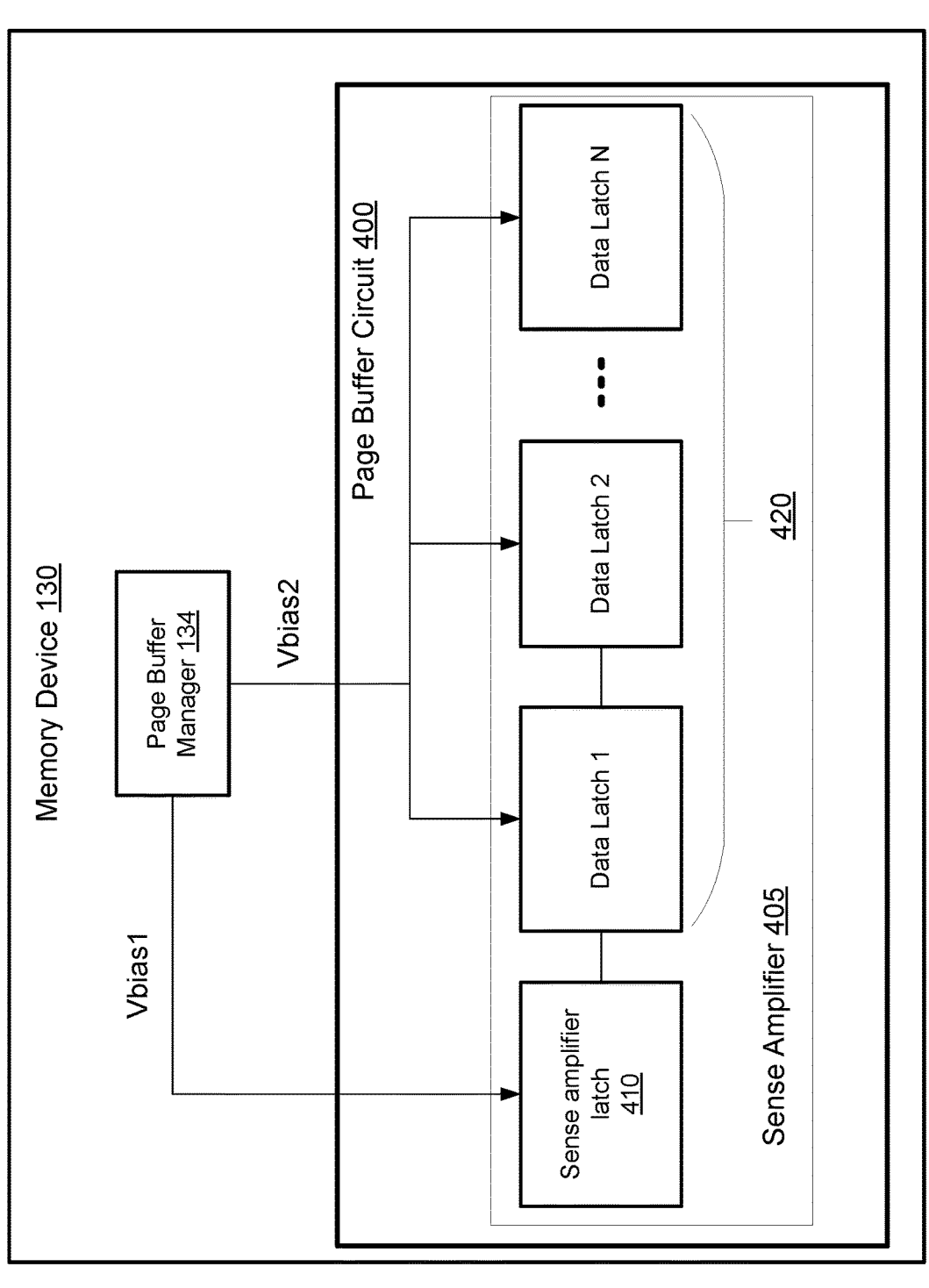
FIG. 4 illustrates an example memory device including a page buffer manager that controls bias voltage levels supplied to a sense amplifier latch of a sense amplifier of a page buffer circuit and a set of data latches of the sense amplifier of the page buffer circuit when the example memory device is in a standby mode, in accordance with one or more embodiments of the present disclosure.

FIG. 4 illustrates an example memory device 130 including a page buffer manager 134 that controls bias voltage levels supplied to a sense amplifier latch 410 of a sense amplifier 405 of a page buffer circuit 400 and a set of data latches 420 of the sense amplifier 410 of the page buffer circuit 400 when a memory device 130 is in a standby mode, in accordance with one or more embodiments of the present disclosure. In an embodiment, the page buffer manager 134 determines when the memory device 130 is operating in a standby mode. When in the standby mode, the page buffer manager 134 controls a first bias voltage level supplied to power the sense amplifier latch 410 of a sense amplifier 405 of the page buffer circuit 400 (Vbias1) and a second bias voltage level supplied to power the set of data latches 420 (e.g., data latch 1, data latch 2 . . . data latch N) of the sense amplifier 405 of the page buffer circuit 420 in view of a target reduction in standby current level that is desired. According to embodiments, a first power domain associated with the sense amplifier latch and a second power domain associated with the set of data latches are segregated or independent controlled by the page buffer manager 134. In an embodiment, although FIG. 4 illustrates a single sense amplifier 405, the memory device 130 can include multiple sense amplifiers 405, where each sense amplifier 405 is associated with a corresponding bitline of the memory device 130. In an embodiment, the page buffer manager 134 can independently control the first bias voltage supplied to the respective sense amplifier latches 410 of the respective sense amplifiers 405 and the second bias voltage supplied to the respective sets of data latches 420 of the respective sense amplifiers 405.

In an embodiment, the page buffer manager 134 determines the memory device 130 has entered the standby mode following a first type of operation (e.g., a suspend operation, a cache operation, etc.) associated with maintaining the storing of data in the sense amplifier latch 410 and the set of data latches 420. In response to identifying the first type of operation, the page buffer manager 134 determines that the sense amplifier latch 410 and the set of data latches 420 are to continue to be powered during the standby mode in order to preserve the data stored therein. In an embodiment, in response to identifying the first type of operation, the page buffer manager 134 adjusts one or both of the first bias voltage supplied to the sense amplifier latch (Vbias1) and the second bias voltage supplied to the set of data latches 420. In an embodiment, the page buffer manager 134 can select the delta voltage level (Vdelta) used to adjust the first bias voltage, the second bias voltage, or both in view of a target standby current reduction level that is desired (e.g., a target reduction in the standby current level of approximately 5 µA).

In an embodiment, in response to identifying the first type of operation and entry of the memory device 130 into the standby mode, the page buffer manager 134 adjusts the first bias voltage by reducing an initial first bias voltage (Vbias1_initial) by a delta voltage level (Vdelta). Accordingly, in this embodiment, the adjusted first bias voltage (Vbias1) supplied to the sense amplifier 410 during standby mode is represented by the following expression:

$$Vbias1 = Vbias1\_initial - Vdelta$$

For example, the page buffer manager 134 can reduce an initial first bias voltage of approximately 2.2V by a Vdelta of approximately 0.7V to establish a Vbias1 of approximately 1.5V that is supplied to the sense amplifier latch 410 while the memory device 130 is in the standby mode. Advantageously, the reduced bias voltage supplied to the sense amplifier latch 410 results in a reduction in standby current consumed by the memory device 130 (e.g., to establish a target standby current reduction of approximately 5 μA), while enabling the sense amplifier to preserve the data stored therein. The data that is preserved can then be used in a subsequent operation (e.g., a resume operation following a suspend operation).

In an embodiment, in response to identifying the first type of operation and entry of the memory device 130 into the standby mode, the page buffer manager 134 adjusts the second bias voltage by reducing an initial second bias voltage (Vbias2_initial) by a delta voltage level (Vdelta). Accordingly, in this embodiment, the adjusted second bias voltage (Vbias2) supplied to the set of data latches 420 during standby mode is represented by the following expression:

$$Vbias2 = Vbias2\_initial - Vdelta$$

For example, the page buffer manager 134 can reduce an initial second bias voltage of approximately 1.8V by a Vdelta of approximately 0.3V to establish a Vbias2 of approximately 1.5V that is supplied to the set of data latches 420 while the memory device 130 is in the standby mode. Advantageously, the reduced bias voltage supplied to the data latches 420 results in a reduction in standby current consumed by the memory device 130 (e.g., a target reduction in standby current of approximately 5 μA), while enabling the sense amplifier to preserve the data stored therein. According to embodiments, the delta voltage level used to establish the first bias voltage level and/or the second bias voltage level can be determined based on the target standby current level.

According to embodiments, the page buffer manager 134 can adjust (e.g., reduce) the first bias voltage supplied to sense amplifier latch 410, the second bias voltage supplied to the set of data latches 420, or both in response to identifying that the memory device 130 is in a standby mode following execution of a first type of operation (e.g., a suspend operation, a cache operation, etc.).

Figure 5:
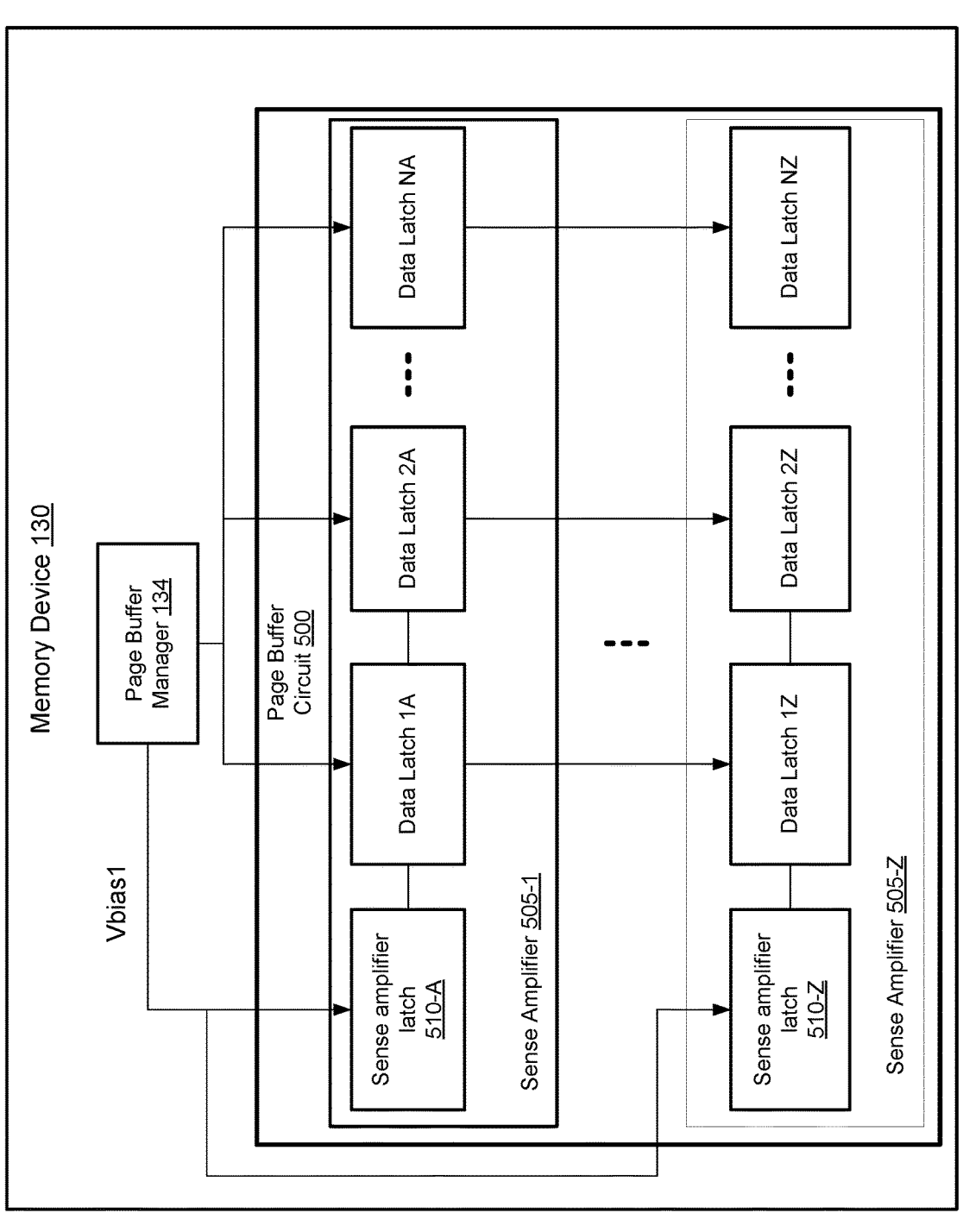
FIG. 5 illustrates an example memory device including a page buffer manager that selectively controls turning off one or more latches of one or more sense amplifiers of a page buffer circuit when the example memory device is in a standby mode, in accordance with one or more embodiments of the present disclosure.

FIG. 5 illustrates an example memory device 130 including a page buffer manager 134 that selectively controls turning off one or more latches of one or more sense amplifiers 505-1 to 505-Z of a page buffer circuit 500 when the memory device 130 is in a standby mode, in accordance with one or more embodiments of the present disclosure. In an embodiment, the page buffer manager 134 determines the memory device 130 has entered the standby mode following an indication that a previous memory access operation is complete. In response, the page buffer manager 134 selectively causes one or more of sense amplifier latch 510-1 of sense amplifier 505-1, sense amplifier latch 510-Z of sense amplifier 505-Z, and/or one or more data latches of the respective sense amplifiers (505-1 through 505-Z) to be turned off such that the selected latches are not supplied with a bias voltage. In an embodiment, the page buffer manager 134 can determine a target standby current level and select one or more of the following to be turned off: one or more sense amplifiers, one or more data latches, or a combination thereof.

In an embodiment, the page buffer manager 134 can turn off a PMOS associated with a set of data latches such that no bias voltage is supplied to the corresponding set of data latches. For example, the page buffer manager 134 can turn off a PMOS associated with the group of first data latches (e.g., data latch 1A through data latch 1Z). In another example, the page buffer manager 134 can turn off a PMOS associated with a group of second data latches (e.g., data latch 2A through data latch 2Z), and so on for all groups of data latches. In an embodiment, the page buffer manager 134 can select which one or more sense amplifier latches, one or more data latches, or combination thereof that are to be turned off and not be supplied a bias voltage when the memory device 130 is in a standby mode. In an embodiment, the page buffer manager 134 can select which latches to turn off based on a target standby current level. Advantageously, by turning off one or more of the sense amplifier latches (510-A through 510-Z), one or more data latches, or a combination thereof, the current consumed during the standby mode is reduced.

FIG. 6 is a flow diagram of an example method 600 to manage bias voltage levels applied to latches (e.g., a sense amplifier latch and a set of data latches) of a sense amplifier of a page buffer circuit when a memory device is operating in a standby mode, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the page buffer manager 134 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a determination is made. For example, processing logic (e.g., the page buffer manager 134 of FIGS. 1A-1B) can determine entry of a memory device into a standby mode. In an embodiment, the memory device enters the standby mode when the memory device is not executing one or more operations (e.g., memory access operations) and is operationally idle. In an embodiment, the processing logic can identify an indication corresponding with a completion of a previous operation to determine that the memory device has entered the standby mode.

At operation 620, a first voltage is applied. For example, the processing logic can cause, during the standby mode of the memory device, a first bias voltage level to be applied to power a sense amplifier latch of a sense amplifier of a page buffer circuit of the memory device. In an embodiment, the processing logic sets or establishes the first bias voltage level (Vbias1) by reducing an initial first bias voltage level (Vbias1_initial) by a delta voltage level (Vdelta). Advantageously, the reduced or adjusted bias voltage level (Vbias1) applied to the sense amplifier latch enables first data stored by the sense amplifier latch to be maintained, while reducing the overall current level consumed when the memory device is operating in the standby mode.

At operation 630, a second voltage is applied. For example, the processing logic can cause, during the standby mode of the memory device, a second bias voltage level to be applied to power one or more data latches of the sense amplifier of the page buffer circuit of the memory device. In an embodiment, the processing logic segregates the power domain of the one or more data latches and the sense amplifier latch, such that the first bias voltage level supplied to the sense amplifier latch is separately controllable from the second bias voltage level supplied to the one or more data latches. According to embodiments, the first bias voltage level is different from the second bias voltage level.

In an embodiment, the processing logic sets or establishes the second bias voltage level (Vbias2) that is supplied to the one or more data latches of the sense amplifier by reducing an initial second bias voltage level (Vbias2_initial) by a delta voltage level (Vdelta). Advantageously, the reduced or adjusted bias voltage level (Vbias2) applied to the one or more data latches enables second data stored by the one or more data latches to be maintained, while reducing the overall current level consumed when the memory device is operating in the standby mode.

In an embodiment, the first bias voltage level and the second bias voltage level can both be reduced or lowered (e.g., reduced from an initial voltage level by a delta voltage) when the memory device is operating in the standby mode. In an embodiment, the processing logic can select one or both of the sense amplifier latch and the one or more data latches to be supplied with an adjusted bias voltage level, when the memory device is in the standby mode.

In an embodiment, the processing logic can establish one or both of the first bias voltage level and the second bias voltage level based on a target or desired standby current level. For example, the processing logic can identify a target standby current level (i.e., an amount of current consumed when the memory device is in the standby mode) and adjust the bias voltage level supplied to one or more of the sense amplifier latch of the sense amplifier or the one or more data latches of the sense amplifier to satisfy the target standby current consumption level.

Figure 7:
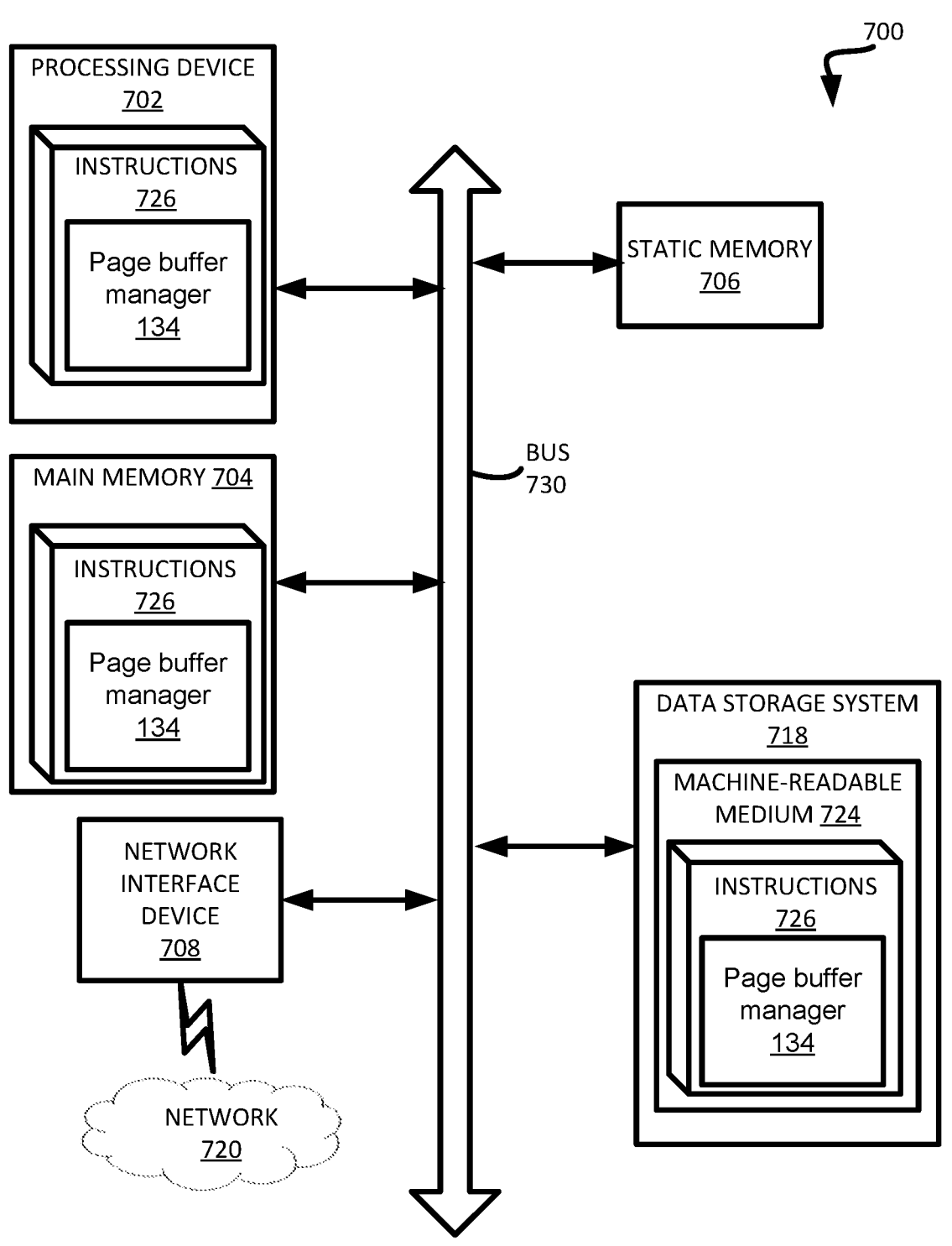
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the page buffer manager 134 of FIG. 1A and FIG. 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a program manager (e.g., the page buffer manager 134 of FIG. 1A and FIG. 1B). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's page buffers and memories into other data similarly represented as physical quantities within the computer system memories or page buffers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:

determining entry of the memory device into a standby mode;
causing, during the standby mode of the memory device, a first bias voltage level to be applied to a sense amplifier latch of a sense amplifier of a page buffer circuit of the memory device; and
causing, during the standby mode of the memory device, a second bias voltage level to be applied to a set of data latches of the sense amplifier of the page buffer circuit of the memory device, wherein the second bias voltage level is different from the first bias voltage level.

2. The memory device of claim 1, the operations further comprising:
establishing the first bias voltage level by reducing an initial first bias voltage level by a delta voltage level, wherein a current level consumed by the memory device during the standby mode is reduced in response to applying the first bias voltage level to the sense amplifier latch.

3. The memory device of claim 2, wherein the sense amplifier latch maintains storage of first data while supplied with the first bias voltage level.

4. The memory device of claim 3, wherein the first data stored by the sense amplifier latch is used in a memory access operation associated with the memory device.

5. The memory device of claim 1, the operations further comprising:
establishing the second bias voltage level by reducing an initial second bias voltage level by a delta voltage level, wherein a current level consumed by the memory device during the standby mode is reduced in response to applying the second bias voltage level to the set of data latches.

6. The memory device of claim 5, wherein the set of data latches maintain storage of second data while supplied with the second bias voltage level.

7. The memory device of claim 1, wherein the memory device enters the standby mode following completion of one or a suspend operation or a cache operation by the memory device.

8. The memory device of claim 7, the operations further comprising:
identifying a target current level to be consumed by the memory device in the standby mode;
determining a delta voltage level in view of the target current level; and
establishing the first bias voltage level by reducing an initial first bias voltage level by the delta voltage level.

9. The memory device of claim 7, the operations further comprising:
identifying a target current level to be consumed by the memory device in the standby mode;
determining a delta voltage level in view of the target current level; and
establishing the second bias voltage level by reducing an initial second bias voltage level by the delta voltage level.

10. A memory device comprising:
a memory array; and
control logic, operatively coupled with the memory array, to perform operations comprising:
determining completion of a memory access operation associated with the memory device;
following completion of the memory access operation, determining entry of the memory device into a standby mode;

identifying a target current level to be consumed by the memory device in the standby mode; and selecting, based on the target current level, at least one of a sense amplifier latch of a sense amplifier of a page buffer circuit of the memory device or a data latch of the sense amplifier of the page buffer circuit to turn off while the memory device is in the standby mode.

11. The memory device of claim 10, wherein the memory access operation comprises a suspend operation or a cache operation.

12. The memory device of claim 10, wherein a current level consumed by the memory device during the standby mode is reduced in response to turning off the at least one of the sense amplifier latch or the data latch.

13. A method comprising:

determining, by a processing device, entry of a memory device into a standby mode;

causing, during the standby mode of the memory device, a first bias voltage level to be applied to a sense amplifier latch of a sense amplifier of a page buffer circuit of the memory device; and causing, during the standby mode of the memory device, a second bias voltage level to be applied to a set of data latches of the sense amplifier of the page buffer circuit of the memory device, wherein the second bias voltage level is different from the first bias voltage level.

14. The method of claim 13, further comprising establishing the first bias voltage level by reducing an initial first bias voltage level by a delta voltage level, wherein a current level consumed by the memory device during the standby mode is reduced in response to applying the first bias voltage level to the sense amplifier latch.

15. The method of claim 14, wherein the sense amplifier latch maintains storage of first data while supplied with the first bias voltage level.

16. The method of claim 15, wherein the first data stored by the sense amplifier latch is used in a memory access operation associated with the memory device.

17. The method of claim 13, further comprising establishing the second bias voltage level by reducing an initial second bias voltage level by a delta voltage level, wherein a current level consumed by the memory device during the standby mode is reduced in response to applying the second bias voltage level to the set of data latches, wherein the set of data latches maintain storage of second data while supplied with the second bias voltage level.

18. The method of claim 13, wherein the memory device enters the standby mode following completion of one or a suspend operation or a cache operation by the memory device.

19. The method of claim 18, further comprising:

identifying a target current level to be consumed by the memory device in the standby mode;

determining a delta voltage level in view of the target current level; and establishing the first bias voltage level by reducing an initial first bias voltage level by the delta voltage level.

20. The method of claim 18, further comprising:

identifying a target current level to be consumed by the memory device in the standby mode;

determining a delta voltage level in view of the target current level; and establishing the second bias voltage level by reducing an initial second bias voltage level by the delta voltage level.

* * * * *